United States Patent
Lin

(10) Patent No.: US 10,418,125 B1
(45) Date of Patent: Sep. 17, 2019

(54) WRITE AND READ COMMON LEVELING FOR 4-BIT WIDE DRAMS

(71) Applicant: CAVIUM, LLC, San Jose, CA (US)

(72) Inventor: David Da Wei Lin, Westborough, MA (US)

(73) Assignee: Marvell Semiconductor, Santa Clara, CA (US)

( * ) Notice: Subject to any disclaimer, the term of this patent is extended or adjusted under 35 U.S.C. 154(b) by 0 days.

(21) Appl. No.: 16/039,922

(22) Filed: Jul. 19, 2018

(51) Int. Cl.
| | |
|---|---|
| G11C 29/00 | (2006.01) |
| G11C 8/18 | (2006.01) |
| G11C 7/10 | (2006.01) |
| G11C 11/4096 | (2006.01) |
| G11C 11/4094 | (2006.01) |

(52) U.S. Cl.
CPC .......... *G11C 29/842* (2013.01); *G11C 7/1063* (2013.01); *G11C 7/1093* (2013.01); *G11C 8/18* (2013.01); *G11C 11/4094* (2013.01); *G11C 11/4096* (2013.01); *G11C 7/109* (2013.01); *G11C 7/1048* (2013.01)

(58) Field of Classification Search
CPC .................................. G11C 29/04; G11C 7/22
USPC .................................................. 365/200, 220
See application file for complete search history.

(56) References Cited

U.S. PATENT DOCUMENTS

| | | | | |
|---|---|---|---|---|
| 3,996,566 | A * | 12/1976 | Moran | G06F 5/01 712/300 |
| 4,180,862 | A * | 12/1979 | Seipp | G05B 19/05 700/1 |
| 4,999,620 | A * | 3/1991 | Ishii | G06F 12/0207 345/549 |
| 5,802,601 | A * | 9/1998 | Kania | G06F 12/0623 711/1 |
| 5,812,472 | A * | 9/1998 | Lawrence | G11C 29/14 365/201 |
| 6,151,273 | A * | 11/2000 | Iwamoto | G11C 7/1072 365/230.03 |
| 6,452,849 | B1 * | 9/2002 | Iwamoto | G11C 29/02 365/201 |
| 6,570,944 | B2 * | 5/2003 | Best | G06F 1/10 375/355 |
| 7,171,321 | B2 * | 1/2007 | Best | G06F 13/1689 702/106 |
| 7,769,942 | B2 * | 8/2010 | Ware | G06F 12/02 710/317 |
| 8,907,809 | B2 * | 12/2014 | Rains, Jr. | G08B 15/00 340/815.67 |
| 9,417,802 | B1 * | 8/2016 | Berke | G06F 3/0611 |
| 10,204,670 | B2 * | 2/2019 | Kim | G06F 12/0246 |

(Continued)

*Primary Examiner* — Michael T Tran

(57) ABSTRACT

System and method of write deskew training for ×4 mode memory control interface configurations. Write leveling logic in the memory controller is adjusted to obtain a write leveling setting for delaying both first and second strobe signals associated with a byte. The adjustment is based on feedback of first set of bits of a byte and irrespective of the feedback of the second set of bits of the byte. The write leveling logic is then anchored at the write leveling setting, and a deskew delay line for the second strobe signal is adjusted to obtain a first deskew setting based on the feedback of the second set of bits. Thus, in write operations, the write leveling setting can be common within the byte even the two strobe signals are transmitted to or received from two different memory storage devices.

21 Claims, 8 Drawing Sheets

(56) References Cited

U.S. PATENT DOCUMENTS

| | | | |
|---|---|---|---|
| 2005/0057995 A1* | 3/2005 | Mitani | G11C 8/10 |
| | | | 365/222 |
| 2007/0253242 A1* | 11/2007 | Parkinson | G11C 7/065 |
| | | | 365/163 |
| 2008/0098277 A1* | 4/2008 | Hazelzet | G06F 11/1044 |
| | | | 714/753 |
| 2009/0089540 A1* | 4/2009 | Hansen | G06F 9/30014 |
| | | | 712/29 |
| 2011/0145644 A1* | 6/2011 | Dwivedi | G01R 31/31715 |
| | | | 714/34 |
| 2012/0195089 A1* | 8/2012 | Ko | G11C 7/1012 |
| | | | 365/63 |
| 2014/0029364 A1* | 1/2014 | Bhakta | G11C 29/022 |
| | | | 365/201 |
| 2017/0031747 A1* | 2/2017 | Kim | G06F 11/0784 |
| 2017/0255406 A1* | 9/2017 | Tomishima | G11C 7/20 |
| 2018/0366168 A1* | 12/2018 | Naruse | G06F 12/00 |
| 2019/0102179 A1* | 4/2019 | Fleming | G06F 9/3017 |

\* cited by examiner

WRITE AND READ COMMON LEVELING FOR 4-BIT WIDE DRAMS

TECHNICAL FIELD

Embodiments of the present invention are related to the field of integrated circuits, and in particular, to deskew mechanisms in memory controllers.

BACKGROUND OF THE INVENTION

In a typical synchronous dynamic random-access memory (SDRAM) design, each data byte (8 bits of data) of a ×8 SDRAM device or each nibble (4 bits of data) of a ×4 SDRAM device is associated with a dedicated data strobe (DQS). In a ×4 mode, two DQS signals (e.g., namely DQS0, DQS1) are used to clock one byte, and each DQS is associated with 4 data bits (DQs); whereas, in a ×8 mode, one DQS (e.g., namely DQS0) is associated with all 8 DQ bits in the byte. The ×4 mode thus requires an extra bidirectional data strobe signal, DQS1, to be sent between the memory controller and the memory. DQs and the differential data strobes (DQSs) are transported through bi-directional buses and are driven by the memory controller during a memory write and driven by the memory during a memory read.

A memory controller usually interfaces with more than one DRAM device to form one memory channel. A common clock/command/control/address is daisy-chained across several memory devices. This is commonly known as fly-by topology. Because of the topology, the clock, command, control and address signals arrive at each device at different time. Thus, the data and data strobe between the controller and each device need to be delayed or pre-launched appropriately to account for the fly-by delay such that the write and read latency perceived by each device will be equal, or leveled. This adjustment process for the write path is called "write leveling" while for the read path it is called "read leveling."

Because the arrival time of the clock, command control and address bus to each device usually is different, the leveling should be done on a per device basis. However, the data width of each device could be different depending on different applications. In the case of ×8 devices being used, for example, all 8 DQ bits and one data bus inversion (DBI) bit to and from each device can be leveled under the same settings. For the case of a ×4 configuration, because there are two devices interfacing with the controller off-chip per byte, there will likely be different insertion delays between them. 4 DQ bits of a ×4 device can be leveled together while another 4 DQ bits within the same byte may need to be leveled differently if two ×4 devices which form the same bytes are having different arrival time on the clock, command, control and address bus.

When the memory controller interfaces with a ×8 device, one set of write and read leveling setting is usually needed per byte. However, when it interfaces with two ×4 devices for a byte, two sets of write and read leveling settings are needed. This adds complexity to the memory controller design.

SUMMARY OF THE INVENTION

Disclosed herein provides a mechanism of achieving common read or write leveling of two strobe signals serving one byte to overcome the different skews from multiple ×4 memory devices.

Embodiments of the present disclosure provide a read deskew training process which includes deskewing the two strobe signals (e.g., DQS0 and DQS0) serving one byte before deskewing the data bits (DQ bits) against their corresponding strobe signals. More specifically, in read deskew training, the strobe signals DQS0 and DQS1 and data signals DQs are supplied from two DRAM devices. A first read deskew delay line for the first strobe signal (DQS0 read deskew delay line) is anchored at a first read deskew setting. The second strobe signal (DQS1) is then deskewed against the DQS0 signal to determine a second read deskew setting (DQS1 read deskew setting) for the second read deskew delay line (DQS1 read deskew delay line). Thus, the read leveling setting can be common within the byte even if the two DQS signals are received from two different memory storage devices. Therefore the memory controller may advantageously only need to maintain one set of read leveling setting. The 4 bit DQ signals (e.g., DQ[3:0]) associated with DQS0 are then deskewed against the DQS0 signal by adjusting the corresponding DQ read deskew delay lines to determine a set of third read deskew settings (lower DQ read deskew settings). Similarly, the other 4 bit DQ signals (e.g., DQ[7:4]) associated with DQS1 are deskewed against the DQS1 signal by adjusting the other 4 DQ read deskew delay lines to determine a set of fourth read deskew settings (upper DQ read deskew settings). The read deskew settings resulting from the read training process are then stored for deskew use in memory read operations in an embodiment, for example in non-training read operations.

In some embodiments, in aligning DQS1 to DQS0, the DQS0 and DQS1 signals are supplied from two ×4 DRAM devices. The deskew training logic uses the DQS0 as reference, particularly using the time-shifted versions of DQS0 as a set of clock signals to oversample the DQS1 which is supplied as a data path signal to the deskew training logic. The set of clock signals includes in-phase and quadrature-phase DQS0 signals. An indication of skew between each clock signal in the set and the data path signal is detected based on the data path samples. Based on the detected skews, the DQS1 read deskew delay line is adjusted until the data path signal and the set of clocks are aligned, thereby producing the DQS1 read deskew setting. In some embodiments, the read training logic may include sense flops coupled with a deskew finite state machine (FSM) to form a closed loop used to adjust the DQS1 read deskew delay line. The clock path of each sense flop is coupled to a clock derived from the DQS0 and the data path of the sense flop is coupled to DQS1. As a result, DQS1 may be aligned with DQS0 at the CPU side irrespective of any delay differences off-chip.

After the two DQS signals are aligned, the DQ bits may be aligned to their own DQS signals sourcing from the same device by using a predetermined pattern. For example, time-shifted versions of the DQS0 are used as clocks to determine the deskew settings for the lower DQ bits, and time-shifted versions of the DQS1 are used as clocks to determine the deskew settings for the upper DQ bits.

In some embodiments, each DQS path has its own 90° delay line used to generate the quadrature phase signals. In this configuration, the clocks and data may come from a common origin. For a clock forwarding system, deterministic jitter having a common source can be tracked with each other and hence such jitter function may be canceled out. The DQS1 90° delay line is used to generate quadrature phase DQS1 clocks for read deskew training and normal read operation of the upper DQ bits. The same delay line is reused to generate quadrature phase DQS0 clocks to assist DQS1 deskew with respect to DQS0 and thereby obtain common read leveling.

Further, embodiments of the present disclosure provide a write deskew training process which includes: (1) aligning the DQS0 signal to a clock signal at the first memory storage device by adjusting the write leveling logic to obtain a write leveling setting; and (2) while using the same write leveling setting for DQS1, adjusting the DQS1 deskew delay line to align the DQS1 signal with a clock signal at the second memory storage device to obtain a DQS1 write deskew setting. As a result, a common write leveling setting can be used for both the upper DQs and the lower DQs.

More specifically, to obtain write leveling, the DQS0 and DQS1 signals are generated from the memory controller, the DRAMs are placed in a write leveling mode, and the DQS0 write deskew delay line is first anchored. Without changing the deskew setting of DQS1 write deskew delay line, the memory controller toggles both DQS0 and DQS1 per JEDEC specification and increments write leveling setting one at a time starting from 0 to the maximum available values, and monitor the feedback from any lower DQ bits from the memory storage device until any of them are asserted, while the feedback from upper DQ bit may be ignored for a particular period.

Once any lower DQ bit is asserted, the same write leveling setting can be kept and the DQS1 write deskew delay line may be adjusted. Under this write leveling setting, the memory controller continues to toggle DQS0 and DQS1, and the upper DQ bit feedbacks may either be asserted or remain at "0" as a result. If it is asserted, the DQS1 write deskew setting may be decreased until the feedbacks are at 0. The deskew setting may then be incremented or walked back by 1 and then at least one or more upper DQ bits may be asserted. This may be the final DQS1 write deskew setting of DQS1 associated with such write leveling setting in an embodiment. On the other hand, if the upper DQ bit feedbacks are 0 as a result of using the write leveling, the DQS1 write deskew setting may be incremented until one or more upper DQ bits are asserted as feedback. This may be the final write deskew setting of DQS1 associated with such write leveling setting in an embodiment. As a result, the common write leveling setting of a byte and write deskew setting of DQS1 are obtained and stored for future use. Optionally, the DQS0 write deskew delay line can be adjusted to achieve a finer deskew resolution.

The DRAMs are then taken out of write leveling mode and back to idle state. Write deskew of DQ bits may then be achieved by conducting memory write and read traffic and adjust write deskew settings of each DQ bit accordingly and followed by data error checks at the controller side. The optimized write deskew setting of each DQ bit may be where it has the bigger margin away from the cases, which may lead to data error.

In some embodiments, a deskew delay line for a data bus inversion feed forward equalization (DBI FFE) signal can be reused for deskewing DQS1 against DQS0 in write operations in the ×4 mode, both normal operations and training operations. This may simplify the logic design for achieving write and read leveling in an embodiment. In the ×8 mode configuration, the deskew delay line of the DBI signal path is served to deskew DBI in both read and write operations. In the ×4 mode, the same deskew delay line is served to deskew the DQS1 path in read operations. Also, the delay line for deskewing the write DBI FFE path in the ×8 mode is reused to deskew DQS1 in write operations in ×4 mode.

The optimized write deskew setting of each DQ bit advantageously allows bigger margin away from the cases which lead to data errors. Without this mechanism as in the conventional art, the controller needs to train and thereby determine two sets leveling settings within a byte as DQS1 and DQS0 likely have different delay skews. This typically requires additional logic, area and power to achieve the same results.

This summary contains, by necessity, simplifications, generalizations and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

Embodiments of the present invention will be better understood from a reading of the following detailed description, taken in conjunction with the accompanying figures, in which like reference characters designate like elements.

DETAILED DESCRIPTION

Figure 1:
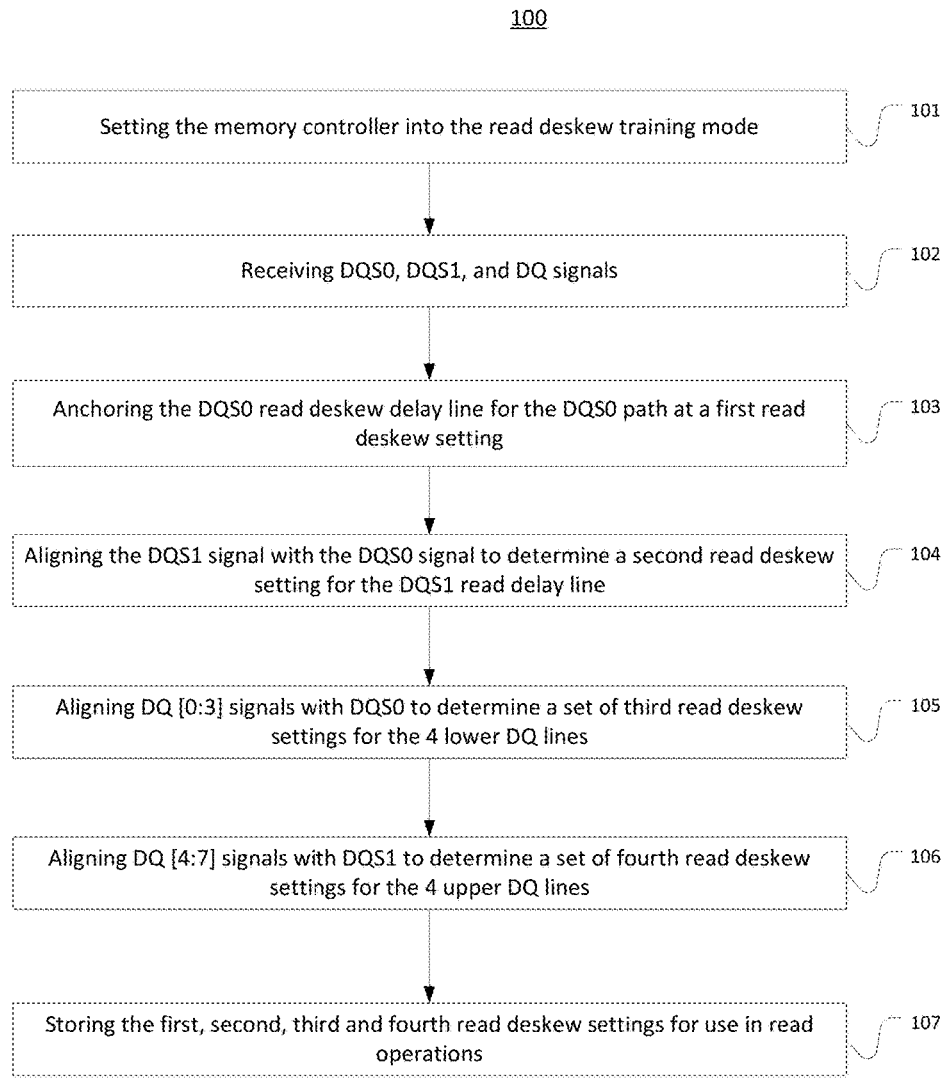
FIG. 1 is a flow chart depicting an exemplary process of read deskew training to determine deskew settings for deskewing strobe signals and data bit signals in memory read operations for the ×4 mode in accordance with an embodiment of the present disclosure.

Reference will now be made in detail to the several embodiments of the present invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail so as not to unnecessarily obscure aspects of the embodiments of the present invention. The drawings showing embodiments of the invention are semi-diagrammatic and not to scale and, particularly, some of the dimensions are for the clarity of presentation and are shown exaggerated in the drawing Figures. Similarly, although the views in the drawings for the ease of description generally show similar orientations, this depiction in the Figures is arbitrary for the most part. Generally, this disclosure can be operated in any orientation.

Write and Read Common Leveling for 4-Bit Wide Drams

Embodiments of the present disclosure provide a mechanism of achieving common read leveling within a byte for the ×4 mode configuration of a memory controller. Two read strobe signals, DQS0 and DQS1, serving different bits of a byte may be aligned by adjusting a DQS deskew delay line. The data bit signals (DQ signals) may then be deskewed against their own strobe signal to determine a set of deskew settings. As the two strobe signals are aligned with (or deskewed against) each other, the read leveling setting may be common within the entire byte even if the two strobe signals are generated from two different memory devices, e.g., DRAMs. Also, a single set of read deskew settings may be maintained by the memory controller in this embodiment.

Further, embodiments of the present disclosure provide a mechanism of achieving common write leveling within a byte for the ×4 mode configuration of a memory controller. The write leveling logic is adjusted to align the write DQS0 signal to a clock signal received at an associated memory storage device, thereby obtaining the write leveling setting, which is used as a common setting for delaying both DQS0 and DQS1. The DQS1 write deskew delay line is then adjusted to align the DQS1 signal to a clock signal received at an associated memory storage device, thereby obtaining the DQS1 write deskew setting. Write deskew training is then performed on the DQ signals by using the common write leveling in combination with the DQS1 write deskew setting. The write leveling setting is common within the byte even if the two strobe signals are transmitted to different memory devices. Thus, a single set of deskew write settings may to be maintained by the memory controller in this embodiment.

Still further, embodiments of the present disclosure provide a memory controller including a separate 90° delay line for each incoming strobe signal (DQS0 and DQS1) so that each of the two strobe signals may have independent quadrature clocks used in read deskew training. The 90° delay line for DQS1 may be used in deskewing DQS1 with respect to DQS0 in the ×4 mode. The same delay line may also be used for generating clocks to sample corresponding DQs with DQS1. Particularly, DQS1 edge before 90° delay line is used to align edges of the DQs and DQS1 signal after 90 delay line is used to sample the eye or data center of the DQs.

In some embodiments, a deskew delay line for a data bus inversion feed forward equalization (DBI FFE) signal may be reused for deskewing DQS1 against DQS0 in write operations in the ×4 mode, both normal operations and training operations. This may simplify the logic design for achieving write and read leveling in embodiments. In the ×8 mode configuration, the DBI deskew delay line serves to deskew DBI in both read and write operations. In the ×4 mode, the same deskew delay line serves to deskew the DQS1 path in both read operations. Also, the delay line for deskewing the write DBI FFE signal in the ×8 mode may be reused to deskew DQS1 in write operations of the ×4 mode. Further the DQS190* delay line may be reused to generate quadrature phase DQS0 clocks during read deskew training of deskewing DQS1 against DQS0.

FIG. 1 is a flow chart depicting an exemplary process 100 of read deskew training to determine deskew settings for deskewing strobe signals and data bit signals in memory read operations for the ×4 mode in accordance with an embodiment of the present disclosure. Process 100 may be performed by the interface logic in a memory controller configured to be coupled to one or more DRAM devices through buses, e.g., external or off-chip DRAM devices. The interface logic has the flexibility to be configured into two data interface configurations such that the memory controller is capable of serving the DRAMs in the ×4 mode as well as the ×8 mode.

At 101, the memory controller is set to a read deskew training mode for the ×4 configuration. Particularly, the interface logic includes deskew control logic to generate corresponding signals to select corresponding components and signal paths to perform the training process, as described in greater detail with reference to FIGS. 2, 3A and 3B. At 102, two read strobe signals DQS0, DQS1 and one byte DQs are received at the interface logic from one or more external memory devices. The DQS0 and DQS1 signals may be generated by, and transmitted from, two separate ×4 DRAM devices via data strobe buses, along with their respectively associated DQ signals.

According to embodiments of the present disclosure, to achieve a common read leveling for the DQs of the same byte, the DQS0 and DQS1 signals are deskewed against each other. In the embodiments described herein, the DQS0 is used as a reference to deskew DQS1. DQS0 is associated with the lower bits DQ[3:0], and DQS1 is associated with the bits DQ[7:4] of the byte. However, it will be appreciated that this arrangement is merely exemplary.

More specifically, at 103, the DQS0 read deskew delay line may be anchored at a first read deskew setting, for example in the center or neutral setting. At 104, the DQS1 signal is then aligned with the DQS0 to determine a second read deskew setting for the DQS1 read deskew delay line. At 105, the lower bit signals DQ[3:0] are aligned with the DQS0 signal to determine a set of third read deskew settings for the DQ read delay lines, and at 106 the upper bit lines DQ[7:4] are aligned with the DQS1 signal to determine a set of fourth read deskew settings for the DQ read delay lines.

At 107, the first, second, third and fourth read deskew settings resultant from 103-106 are stored for later use in normal read operations to deskew DQS0, DQS1 and DQs signals.

The read deskew training logic used to perform the read deskew training process 100 can be implemented in any suitable structure and configuration, and by using hardware logic, software logic, firmware logic or any combination thereof, without departing from the scope of the present disclosure. In an exemplary memory controller, the interface logic configured for one byte is composed of a DQS logic block (DQS block 200 in FIGS. 2, 3A and 5A), and DQ logic blocks (e.g., DQ[4] block 300 and DQ[3] block 350 in FIGS. 3B and 5B). As described in greater detail below, by the control of the control logic, a range of components in the interface logic are designed to be reused in different data interface configurations and different operations modes.

Figure 2:
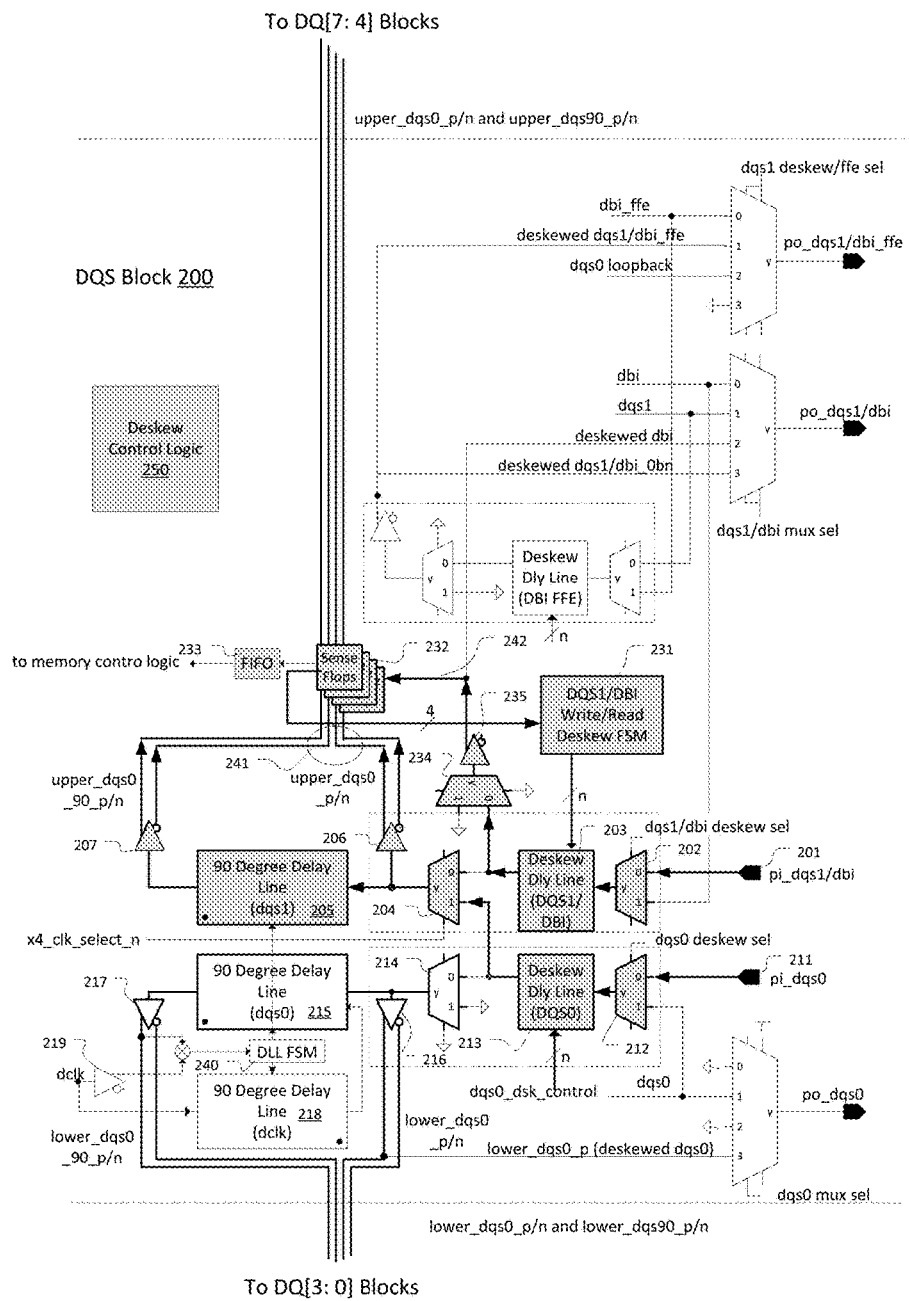
FIG. 2 illustrates the configuration of the strobe logic block of the exemplary interface logic with the highlighted signal paths used to achieve common read leveling for the ×4 mode in accordance with an embodiment of the present disclosure.

FIG. 2 illustrates the configuration of the strobe logic block 200 of the exemplary interface logic with the highlighted signal paths used to achieve common read leveling for the ×4 mode in accordance with an embodiment of the present disclosure.

The DQS block 200 may be configured to serve multiple functions. In the ×4 mode normal read and write operations, it can be configured to deskew DQS0 and DQS1 signals. It also may include read training logic and write training logic configured to perform read and write deskew training for DQS signals. In the ×8 mode, the block 200 can be configured to deskew DQ, DBI and DBI FFE signals in normal read and write operations, as well as to perform read and write deskew training for DBI, DBI FFE and DQ signals. In this example, DQS1 and DBI signals may share the same input and output pins; however the present disclosure is not limited thereto. The DQS block 200 includes, or coupled to, the deskew control logic 250, which is configured to generate control signals and multiplexer (MUX) select signals according to the different data interface configurations and different operations, as described in greater detail below.

In the illustrated example, the read deskew training logic includes the flip-flops 232 (e.g., "sense flops") and the finite state machine (FSM) 231 (e.g., "DQS1/DBI Write/Read Deskew FSM") forming a closed loop system. During a deskew training operation, the clock paths 241 of the sense flops 232 receive time-shifted versions of a clock path signal (the reference signal), which includes an in-phase positive signal, a quadrature-phase positive signal, an in-phase negative signal, and a quadrature-phase negative signal (upper_dqs0_90_p/n and upper_dqs0_pn).

The active components and signal paths may be used in aligning DQS1 against DQS0 in a read deskew training process are shown in shade and arrowed bold lines in FIG. 2. The input pins pi_dqs1/dbi 201 and pi_dqs0 211 respectively receive incoming DQS0 and DQS1 signals from one or two memory storage devices. The input DQS0 is supplied to the DQS0 variable delay line 213 (shown as "Deskew Dly Line (DQS0)") via the MUX 212 as selected by the signal "dqs0 deskew sel." The deskew setting of the DQS0 delay line 213 is anchored as controlled by the signal "dqs0_dsk_control." By control of the select signal "×4_clk_ select_n" of the MUX 204, the DQS0 signal is directed to the buffer 206 to generate its in-phase positive and negative signals (collectively "upper_dqs0_p/n"). Through the DQS1 90° delay line 205 (shown as "90 Degree Delay Line (dqs1)") and the buffer 207, quadrature phase positive and negative signals (collectively "upper dqs0_90_p/n") are also derived from DQS0. These time-shifted versions of DQS0 are supplied to the clock paths 214 of the sense flops 232.

The DQS1 may be supplied to the sense flops 232 as the data path signal via the DQS1 deskew delay line 203 (shown as "Deskew Dly Line (DQS1/DBI)). The sense flops may be configured as an oversampling circuit to generate four samples of the data path signal (input to the flip-flops) at each clock cycle. The four samples are provided to the controller FSM 231 by the sense flops 232. Based on the skews between the clocks and the sampled data signal as detected by the sense flops 232, the FSM 231 can accordingly adjust the DQS1 deskew delay line 203. For instance, the DQS1 delay line 203 has a tuning range of 0° to +22.5°. However the tuning range may be set depending on each application. The final setting of the DQS1 delay line is then stored for later use in deskewing DQS1 in normal read operations.

The variable deskew delay lines described herein may be implemented in any suitable manner. For example, a variable delay line may include a plurality of buffers and a delay setting thereof corresponds to the number of buffers used to delay an input signal.

According to embodiments of the present disclosure, the DQS block 200 includes a separate 90° delay line for each incoming strobe signal, DQS0 and DQS1. The 90° delay lines 205 and 215, along with the 90° delay line (dclk) 218 may each be controlled by the DLL FSM 240. In the read deskew training process for the ×4 mode, the DQS1 90° delay line 205 may be used to generate the quadrature phase positive and negative DQS0 signals for supply to the sense flops 232 and thereby to deskew DQS1 against DQS0.

Once the alignment between DQS0 and DQS1 is achieved, the read leveling setting of DQS0 and DQS1 can be common within the byte even if the two DQS signals are generated from two difference devices. Subsequently, the close loop system with the FSM is broken and the settings are stored for future use. The next step is to further align DQ bits to their own DQS signals sourcing from the same device.

Figure 3A:
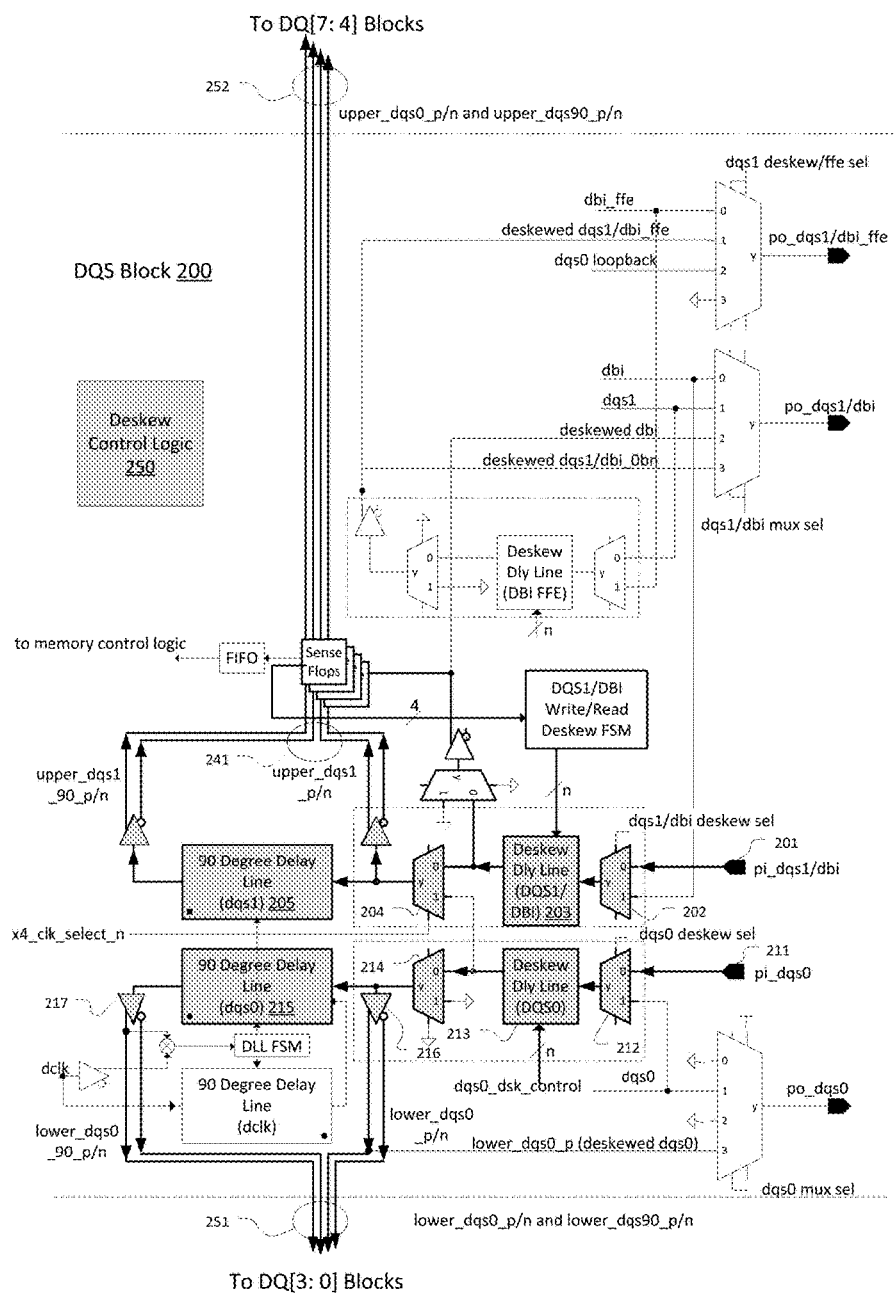
FIG. 3A illustrates the configuration of the DQS block with the highlighted signal paths used for aligning the DQs against the DQSs in read deskew training for the ×4 mode in accordance with an embodiment of the present disclosure.
Figure 3B:
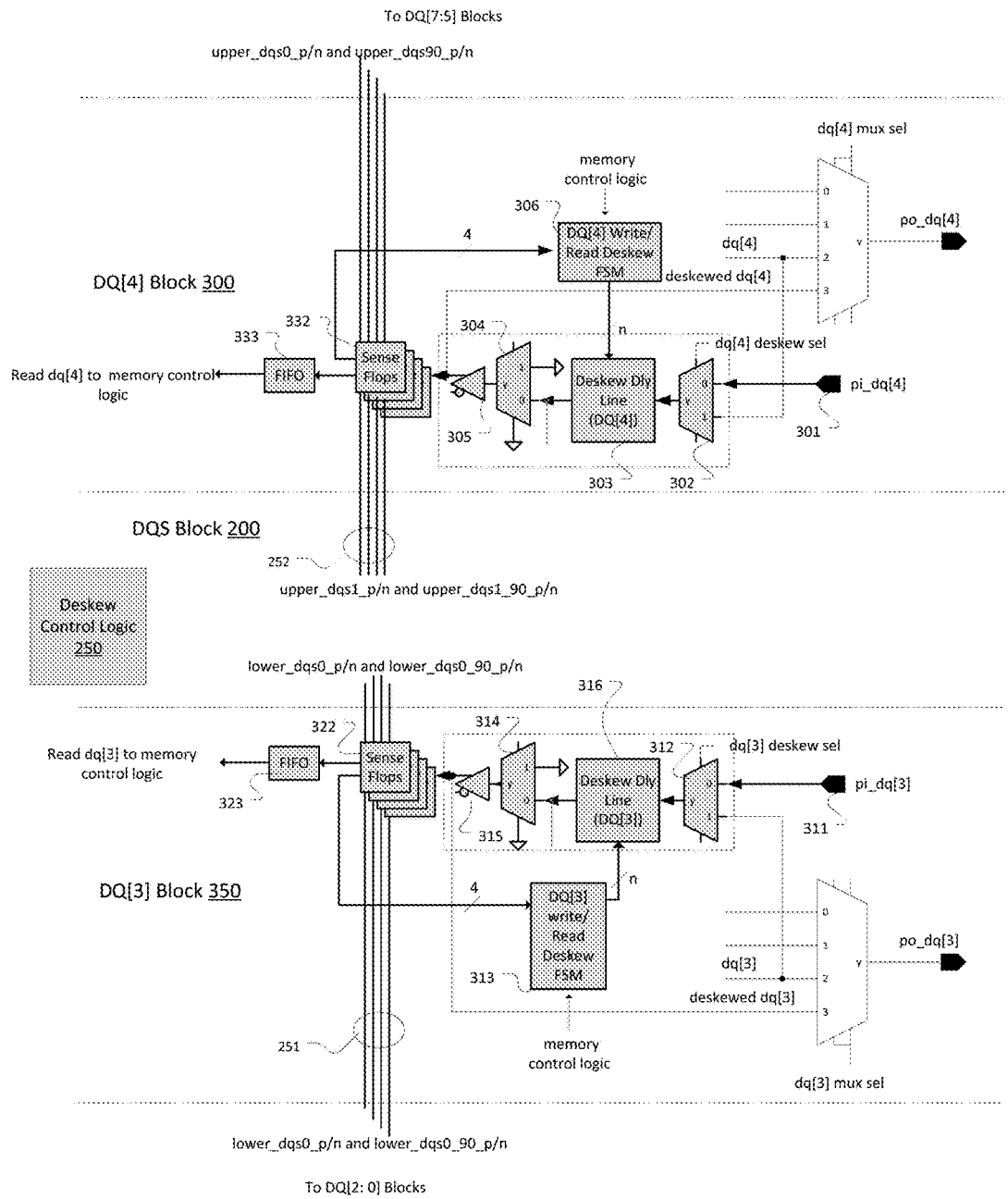
FIG. 3B illustrates the configuration of the DQ blocks with the highlighted signal paths used for aligning the DQs against the DQSs in read deskew training for the ×4 mode in accordance with an embodiment of the present disclosure.

FIG. 3A illustrates the configuration of the DQS block 200 with the highlighted signal paths used for aligning the DQs against the DQSs in read deskew training for the ×4 mode in accordance with an embodiment of the present disclosure. FIG. 3B illustrates the configuration of the DQ blocks with the highlighted signal paths used for aligning the DQs against the DQSs in read deskew training for the ×4 mode in accordance with an embodiment of the present disclosure. The components and signals paths actively used in this process are shown in shade and bold lines.

In the illustrated example, DQS0 is the data strobe of DQ[3:0] while DQS1 is the data strobe of DQ[7:4]. Because this is in the ×4 mode, DBI bit is no longer present in an embodiment. As shown in FIG. 3A, the MUX 204 at the input of DQS1 90° delay line 205 is reconfigured so it outputs DQS1 instead of DQS0, as controlled by the select signal "×4_clk_select_n". The DQS1 signal propagates through the MUX 202, Deskew Dly Line (DQS1/DBI) 203, the MUX 204, and the DQS1 90° delay line 205. The DQS0 signal propagates through MUX 212, Deskew Dly Line (DQS0) 213, the MUX 214, and the 90° delay line (dqs0) 215.

With this reconfiguration, the upper clocks (upper dqs1_p/n and upper dqs1_90_p/n) are derived from the DQS1 and directed to the upper DQ blocks via paths 252; whereas the lower clocks (lower_dqs0_p/n and lower_dqs0_90_p/n) are derived from DQS1 and directed to the lower DQ blocks via paths 251.

Even though DQS1 has been aligned to the DQS0 and either DQS may be able to generate the same phases of clocks, the clocks for upper and lower DQs may be derived from their own strobe signals in the read deskew training process. In this way, the clocking and data of each nibble (DQ[7:4] or DQ[3:0]) come from a common origin. This is important to a clock forwarding system because any deterministic jitter would now have a common source and can be tracked with each other, hence such jitter function can be advantageously canceled out. However, it will be appreciated that, in some other embodiment, a single DQS signal may be used to generate clocks for both the upper and the lower DQs.

Once the configuration of the clock sources is done, a round of pre-defined data pattern is generated from the coupled DRAMs and all the DQ bits in the byte are deskewed against their own DQS through FSMs within each DQ block (e.g., FSM 306 in the DQ[4] block 300, and FSM 313 in the DQ[3] block 350 in FIG. 3B).

More specifically, the DQ[4] data signal is received at the input pin pi_dq[4] 301, passes through the MUX 302 as controlled by the select signal "dq[4] deskew sel," the DQ[4] variable delay line 303 (shown as Deskew Dly Line (DQ [4])), the MUX 304, the buffer 305 and then is sent to the data path of the sensor flops 332. The time-shifted versions of DQS1, including "upper_dqs1_p/n" and "upper_dqs1_90_p/n," are input to the clocks paths of the sense flops 332. The sensed skews are fed to the DQ[4] Write/Read Deskew FSM 306 which accordingly adjusts the DQ[4] delay line 303 until the DQ[4] signal is aligned with DQS1. The final setting of the DQ[4] delay line 303 is stored in DQ[4] Write/Read Deskew FSM 306 for later deskew use in normal read operations. A series of DQ[4] signal during read will be further forwarded to FIFO 333, pending for data retrieval from the memory controller.

Similarly, the DQ[3] data signal is received at the input pin pi_dq[3] 311, propagates through the MUX 312 as controlled by the select signal "dq[3] deskew sel," the DQ[3] variable delay line (shown as "Deskew Dely Line (DQ[3])), the MUX 314, the buffer 315 and then is input to the data path of the sensor flops 322. The time-shifted versions of DQS0, including "lower_dqs0_p/n" and "lower_dqs0_90_p/ n," are input to the clocks paths of the sense flops 322. The sensed skews are fed to the DQ[3] Write/Read Deskew FSM 313 which accordingly adjusts the DQ[3] delay line 313 (shown as "Deskew Dely Line (DQ[3])") until DQ[3] is aligned with DQS0. The final setting of the DQ[3] delay line 313 is stored in DQ[4] Write/Read Deskew FSM 306 for later use in normal read operations. A series of DQ[3] signal during read will be further forwarded to FIFO 322, pending for data retrieval from the memory controller.

System and method of read deskew training to align a DQ against its DQS by using the DQ block training logic is described in greater detail in the U.S. Pat. No. 9,721,627, entitled "Method and apparatus for aligning signals," the content of which is herein incorporated by reference for all purposes.

Referring back to FIG. 2, when the interface logic is configured in the x8 mode, the DQS block 200 can operate to generate DQS0 clocks used as references for read deskew training of a DBI and all 8 DQ signals. For reading deskew training of a DBI signal with respect to a DQS signal in the x8 mode, the signal path and components in read deskew training of DQS1 signal with respect to a DQS0 are reused. The DBI is input to the read training logic as the data path signal and aligned against the clock path signals derived from DQS0. More specifically, the pi_dqs1/dbi pin 201 may be used to receive the incoming DBI instead of DQS1 signal in this mode. To align the DBI signal with the DQS0 received at pi_dqs0 211, the DQS0 signal propagates through the MUX 212, the DQS0 deskew delay line 213 (shown as Deskew Dly Line (DQS0)), and the MUX 204. Time-shifted versions of the DQS0 are derived from the output of the MUX 204 and supplied to the sense flops 232 via the clock paths 241. The DBI signal is input to the data path 242 of the sense flops 232 via the MUX 202, the Deskew Dly Line (DQS1/DBI) 203, the MUX 234 and the buffer 235. The DQS/DBI Write/Read Deskew FSM 231 operates to adjust the Deskew Dly Line (DQS1/DBI) 203 until the DBI signal is aligned with the DQS0. The final setting of the delay line 203 is stored to the DQS1/DBI Write/Read Deskew FSM for later deskew use in normal read operations. A series of DBI signal during read will be further forwarded to FIFO 233, pending for data retrieval from the memory controller.

For read deskew training of the DQ signals with respect to the DQS0 in the x8 mode, the memory controller requests pre-defined patterns generating from DRAMs and first anchoring the deskew settings for the Deskew Dly Line (DQS0) 213 through the signal "dqs0_dsk_control." According to embodiments of the present disclosure, with the introduction of the DQS1 90° delay line 205, the incoming DQS0 signal (pi_dqs0) can be directly split into lower and upper dqs0_90_p/n clocks through two 90° delay lines 205 and 215. An embodiment can avoid multiplexing clock signals by using a single 90° delay line to avoid a far more complicated circuit design.

In the x8 mode, where there is only DQS0 as the data strobe source from the DRAMs, sense flops in each DQ block (e.g., 332 in DQ block 300 in FIG. 3B) oversample the DQ signal by using the clocks derived from a common DQS0 signal in the DQS block 200. In the DQ blocks the active components and signal paths used in read deskew training of DQs against DQS0/DQS1 for the x4 mode (as shown in FIG. 3B) are reused for read deskew training of DQs against the DQS0 for the x8 mode. The derived clocks from the DQS0, including the in-phase and quadrature phase positive and negative signals, are supplied to the DQ blocks and used to clock the sense flops (e.g., 332 and 322). Accordingly, the deskew delay line (e.g., 303 or 316) of each DQ bit can be fine tuned by control of the deskew FSM (e.g., 306 or 313).

Figure 4A:
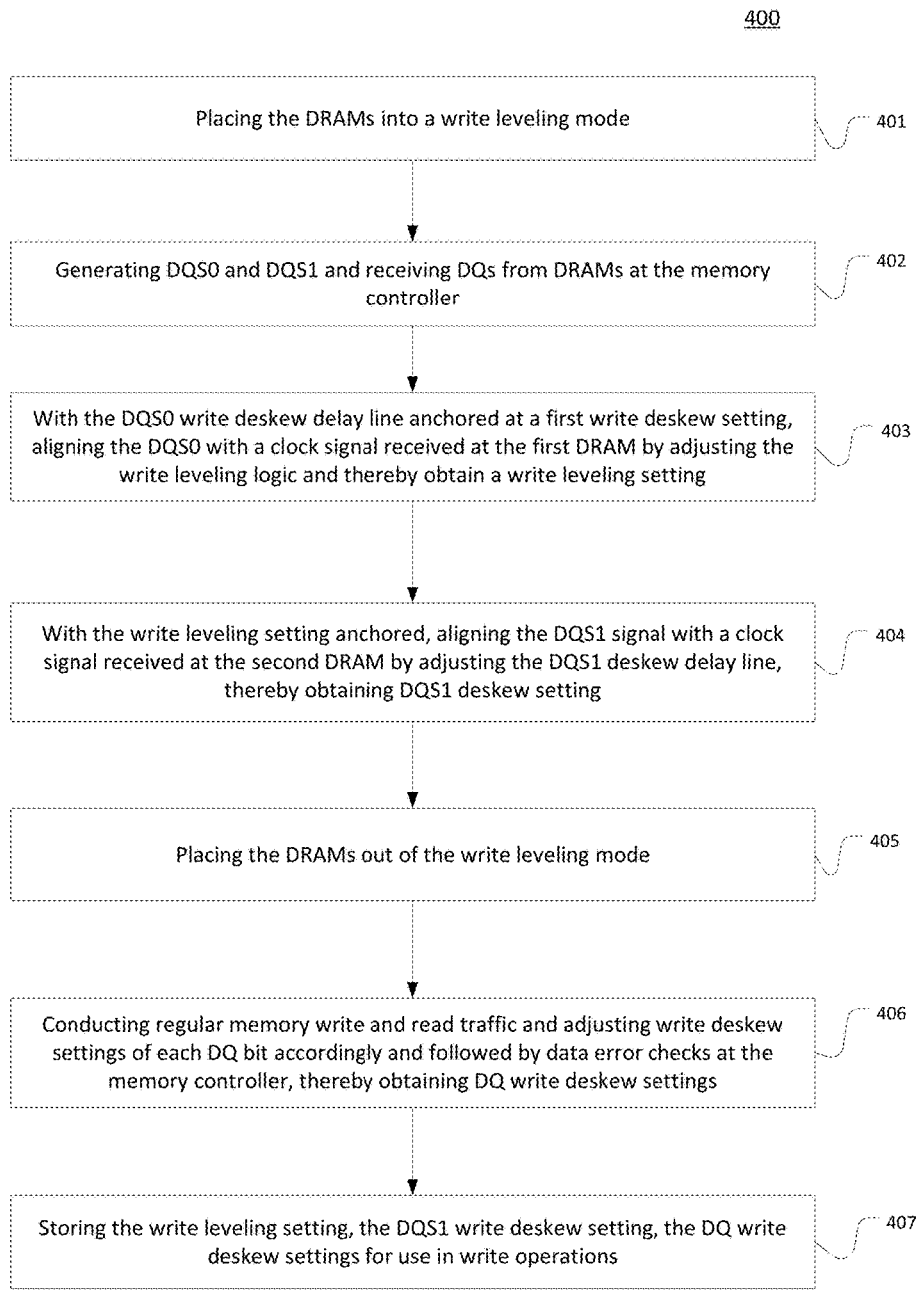
FIG. 4A is a flow chart depicting an exemplary process of write deskew training to determine write leveling settings and write deskew settings for the ×4 mode in accordance with an embodiment of the present disclosure.

FIG. 4A is a flow chart depicting an exemplary process 400 of write deskew training to determine write leveling settings and write deskew settings for the x4 mode in accordance with an embodiment of the present disclosure. As described in greater detail with reference to FIGS. 5A and 5B, Process 400 may be performed by reconfiguring the same interface logic as shown in FIGS. 2, 3A and 3B. However, it will be appreciated that process 400 may be implemented in any other suitable structures and configurations without departing from the scope of the present disclosure and may be implemented by using hardware logic, software logic and firmware logic or a combination thereof.

Figure 5A:
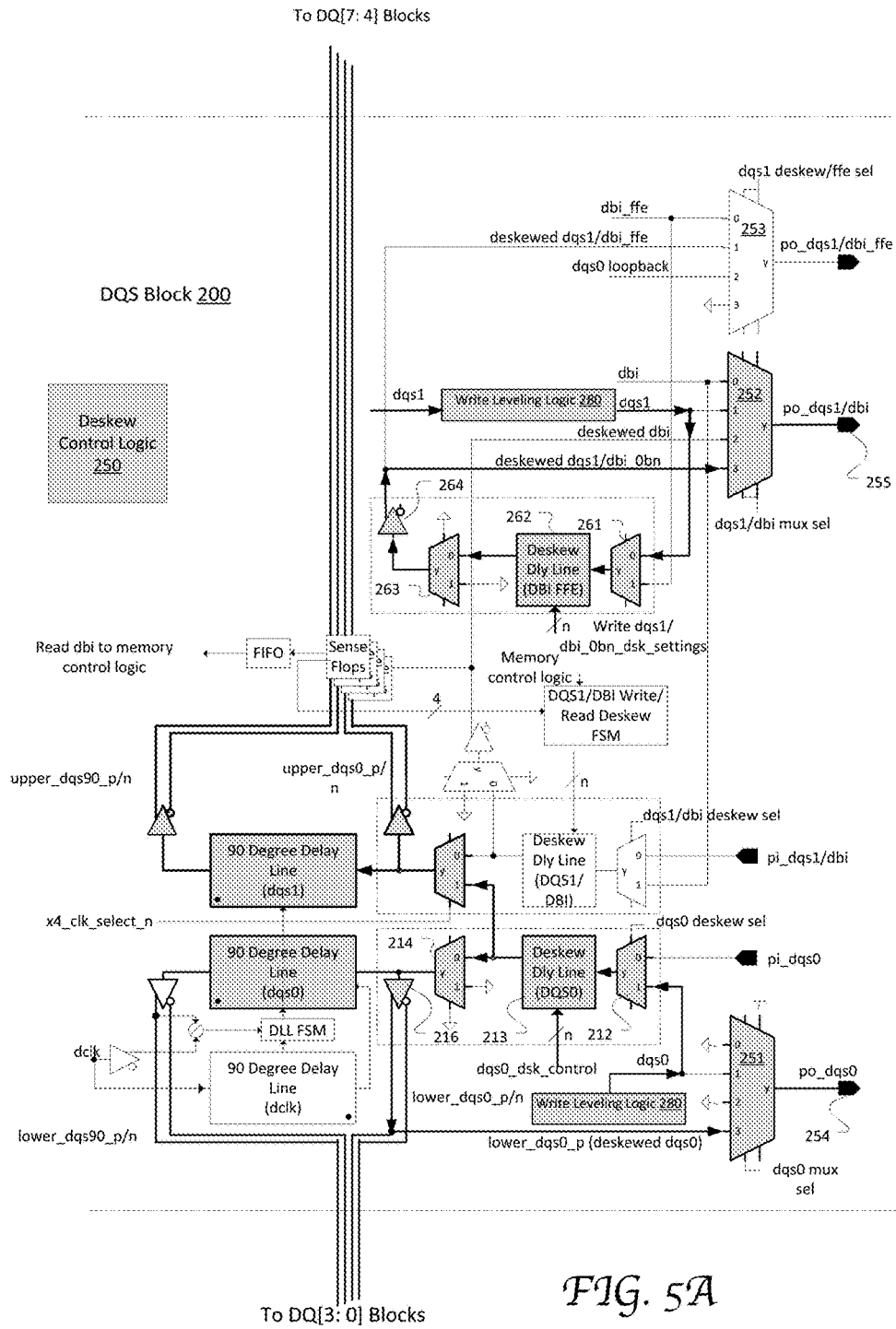
FIG. 5A illustrates the configuration of the strobe logic block of the exemplary interface logic with the highlighted signal path used for achieving common write leveling in accordance with an embodiment of the present disclosure.

In the exemplary memory controller described herein, the deskew control logic in the interface logic can generate corresponding signals to control the various components in the interface logic to perform the training process, as described in greater detail with reference to FIGS. 5A-5B.

According to embodiments of the present disclosure, a common write leveling setting for DQSs and DQs of the same byte is obtained before write deskewing training for the DQs. This can be achieved by engaging the DRAMs into a write leveling mode based on instructions from JEDEC Dual Data Rate (DDR) related specifications. Once the DRAMs are in the write leveling mode, DQS0 and DQS1 traffic are generated from the memory controller and respectively checked or leveled against the clock signal CK received at each DRAM device while monitoring the values of the DQ bits as supplied from the DRAM devices. When the alignment between the DQS and CK is achieved, DQ signals are asserted as feedback to the memory controller.

In the embodiments described in detail herein, the same deskew delay line of each DQ bit is used for both read and write operations, and thus the deskew settings resulting from the read and write deskew training processes will be applied to the same delay line for read or write operations respectively. However, it will be appreciated that the present disclosure is not limited to such configuration.

As shown in FIG. 4A, at 401, the DRAMs are placed into the write leveling mode. At 402, the memory controller generates the DQS0, DQS1 for transmission to the one or more DRAMs. In this mode, DQ signals are generated by the one or more DRAMs and received by the memory controller. At 403, with the DQS0 write deskew delay line anchored at a first write deskew setting, the DQS0 is aligned with the clock signal received at the DRAM (e.g., a first DRAM) by adjusting the write leveling logic. The final setting of the write leveling logic is the common write leveling setting for delaying both DQS0 and DQS1.

At 404, with the write leveling setting anchored, the DQS1 signal is aligned with the clock signal received at the DRAM (e.g., a second DRAM or the first DRAM) by adjusting DQS1 write deskew delay line. The final setting of the DQS1 write deskew delay line is the DQS1 deskew setting. In the normal write operations, the DQS1 is to be delayed by using the combination of the DQS1 write deskew setting and the write leveling setting.

Optionally, after write leveling setting adjustment is completed, the DQS0 delay line can be adjusted as it offers finer deskew resolution for DQS0 than the write leveling logic in some embodiments. For example, write leveling can increment DQS0 delay at a ⅛ clock granularity, while the variable delay line can offer a resolution in a pico-second range. During operation, the DQS0 deskew delay setting can be decremented. When memory controller receives feedback on the lower DQ bus from DRAMs, they may be asserted when the write leveling setting is achieved, e.g., DQS is aligned with clock. By decrementing DQS0 deskew setting and observe response on DQ bus while running write leveling training again, the DQ bus may eventually go back to 0 and this is the point of DQS0 deskew of a finer resolution.

At 405, the DRAM(s) is taken out of the write leveling mode. At 406, the regular write and read traffic is conducted between the memory controller and the DRAM(s). The write deskew delay line of each DQ may be adjusted accordingly and followed by data error checks at the memory controller, when read deskew training has been conducted and when the data errors occurred through memory traffic is caused by errors during write operation at this point. The final setting of each DQ write deskew delay line is the DQ write deskew setting.

In some embodiments, during the deskew training of a DQ bit against its DQS, a sweep of deskew delay lines on the DQ bits may then be performed along with the each write and read transaction to and from same address. Along with each round trip loop of transaction followed by data error check, the memory controller can compile a data passing window associated with the sweep of deskew delay lines. The memory controller can then pick the middle settings of the deskew delay line of each DQ bit as the final set of deskew settings. This set of deskew settings for the write is then stored aside for later use.

An embodiment of aligning a DQ bit against a DQS in write deskew training is described in detail in the U.S. Pat. No. 9,502,099, entitled "MANAGING SKEW IN DATA SIGNALS WITH MULTIPLE MODES," the entire content of which is incorporated by reference herein for all purposes.

At 407, the write leveling setting, the DQS1 write deskew setting, the DQ write deskew settings are stored for later deskew use in normal write operations. In the embodiments that the same deskew delay line of each DQ bit is used for both read and write operation, the previously stored deskew settings will be applied to the delay line appropriately for read or write operation.

Figure 4B:
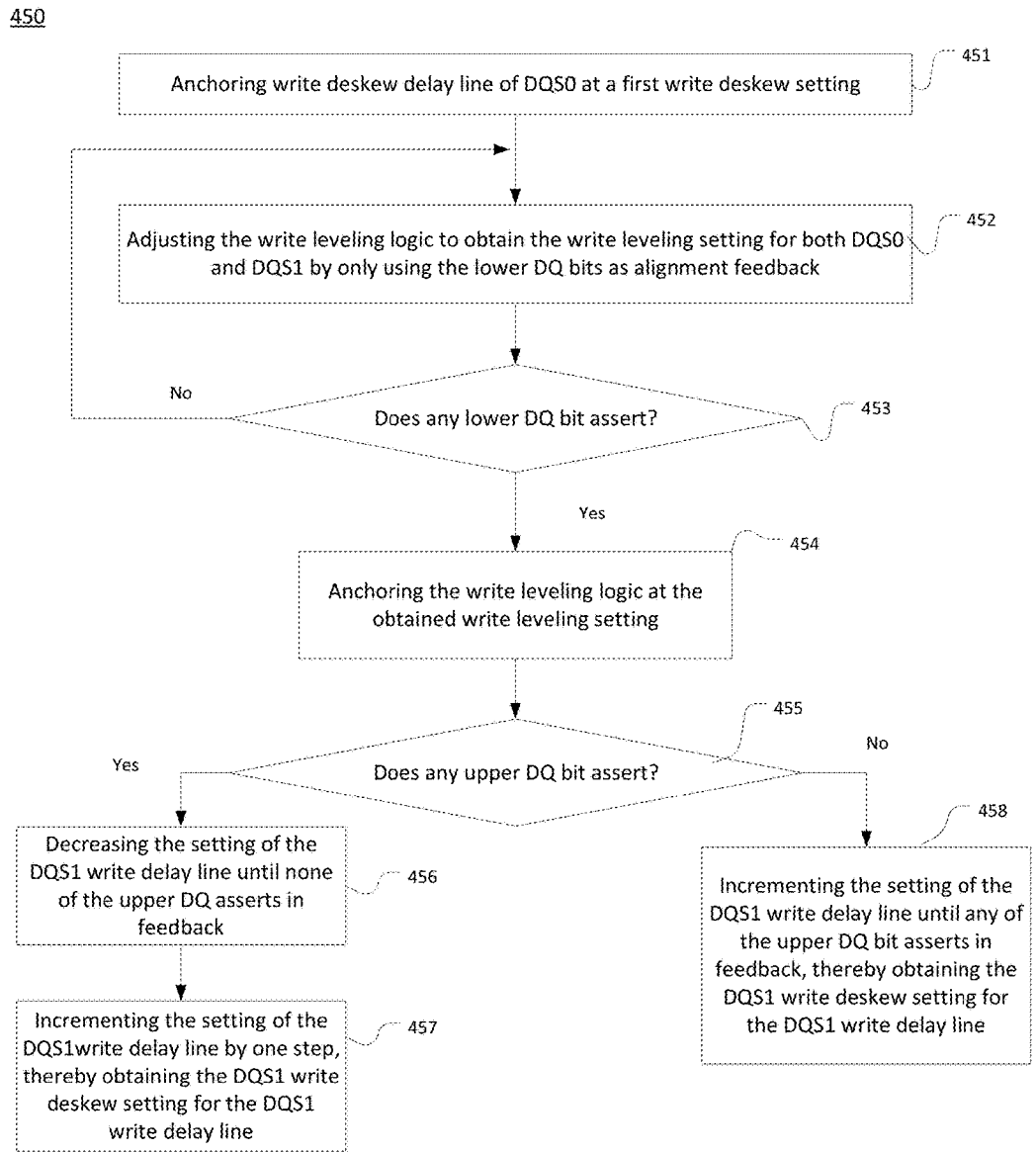
FIG. 4B is a flow chart depicting an exemplary process of achieving a common write leveling in accordance with an embodiment of the present disclosure.

FIG. 4B is a flow chart depicting an exemplary process 450 of achieving a common write leveling in accordance with an embodiment of the present disclosure. Process 450 may correspond to the 403 and 404 in FIG. 4A. At 451, the DQS0 write deskew delay line is anchored at a certain deskew setting, normally in the middle of the delay line range. At 452, without changing the deskew setting of DQS1 write deskew delay line, the write leveling logic is adjusted to obtain the write leveling setting for both the DQS0 and DQS1 by monitoring only the lower DQ bits feedbacks. Particularly, the memory controller toggles both DQS0 and DQS1 per JEDEC specification and increments write leveling setting one at a time starting from 0 to the maximum available values, and monitor the feedback from any lower DQ bits from the memory storage device until any of them is asserted (as determined at 453), while the feedback from upper DQ bit can be ignored for now.

Once any lower DQ bit is asserted, the write leveling logic is anchored at the same write leveling setting at 454 and the DQS1 write deskew delay line is adjusted by the steps 455-458. Particularly, under this write leveling setting, the memory controller continues to toggle DQS0 and DQS1, and the upper DQ bit feedbacks are either asserted as "1" or remained "0" as a result. If it is asserted (as determined at 455), the deskew setting of the DQS1 write deskew delay line may be decreased until the feedbacks are each 0 at 456. At 457, the deskew setting is then incremented or walked back by 1 and now at least one or more upper DQ bits is asserted. This may be the final DQS1 write deskew setting of DQS1 associated with such write leveling setting.

On the other hand, if the upper DQ bit feedbacks are 0 as a result of using the write leveling (as determined at 455), the deskew setting of the DQS1 write deskew delay line is incremented until one or more upper DQ bits are asserted as feedback at 458. This may be the final write deskew setting of DQS1 associated with such write leveling setting. As a result, the common write leveling setting of a byte and write deskew setting of DQS1 are obtained and stored for future use.

Generally speaking, write deskew training may be performed after read leveling is completed through the read deskew training process. This may be because the DRAMs are simply served as a storage and the memory controller has no knowledge of whether data is written and stored properly until the subsequent data read from the same address is checked. So with the read paths timing being optimized after read deskew training, the data error check done by the memory controller through the read followed by the write to the same address is most likely caused by the prior write to the same address. However, this discussion is merely exemplary, the present disclosure is not limited thereto.

According to embodiments of the present disclosure, the interface logic shown in FIGS. 2, 3A and 3B can be reconfigured to perform write deskew training for the ×4 mode. FIG. 5A illustrates the configuration of the strobe logic block 200 of the exemplary interface logic with the highlighted signal path used for achieving common write leveling in accordance with an embodiment of the present disclosure. The active components and signal paths are shown in shade and arrowed bold lines.

In the illustrated example, the write leveling logic 280 is adjustable and operable to delay both DQS0 and DQS1 according to a common write leveling setting. However, in some other embodiments, DQS0 and DQS1 are coupled to different write leveling logic which can still share the same write leveling setting as obtained as described with reference to FIGS. 4A and 4B.

During aligning the DQS0 against the CK received at the DRAM, the DQS0 write signal generated by the memory controller is directed to the MUX 212 (shown as signal "dqs0" at the input "1" of MUX 251). The DQS0 propagates through the write leveling logic 280, Deskew Dly Line (DQS0) 213, the MUX 214, and the buffers 216. The resultant signal "lower_dqs0_p" is transmitted to the DRAM at the output pin p0_dqs0 254 via a transmitter (not shown). The signal "dqs0_dsk_control" is generated by the memory control logic and controls the Deskew Dly Line (DQS0) 213 to anchor at a first setting. The write leveling logic 280 is adjusted based on the lower bit DQ feedbacks to obtain the common write leveling setting.

The DQS1 signal generated by the memory controller is directed to the MUX 261 (shown as signal "dqs1" at the input "1" of MUX 252), The DQS1 is further routed through the write leveling logic 280, Deskew Dly Line (DBI FFE) 262, the MUX 263, and the buffers 264. The resultant signal "deskewed dqs1/dbi_obn" is transmitted to the DRAM device at the output pin p0_dqs1/dib 255 via a transmitter (not shown). The signal "Write dqs1/dbi_0bn_dsk_settings" is generated by the deskew control logic 250 and controls the DQS1 write deskew line 262 (shown as Deskew Dly Line (DBI FFE)) to increment or decrement based on the upper DQ bit feedback from the DRAM device (as in 454-457 in FIG. 4B) while the write leveling logic is anchored at the common leveling setting, as described above.

In the ×8 mode write deskew training as well as normal write operations, the Deskew Dly Line (DBI FFE)) 262 can be reused to deskew a DBI FFE signal ("dbi_ffe"). In this configuration, the MUX 261 outputs the "dbi_ffe" signal to the Deskew Dly Line (DBI FFE)) 262, as controlled by its select signal. The "dbi_ffe" signal is further routed through the MUX 263, and the buffer 264. The resultant signal "deskewed_dqs1/dbi_ffe" is selected and output by the MUX 253 and is transmitted to a transmitter (not shown) via a output pin p0_dqs1/dbi_ffe 255 to perform Feed-Forward Equalization (FFE) with po_dqs1/dbi together before sending out to a DRAM device. The control of MUX 253 is done by the select signal "dqs1 deskew/ffe sel".

In the ×4 mode, with proper control of multiplexers, the same deskew delay lines used for read path deskew can be re-used for write path deskew as well. Write deskew training can be done after read deskew training is completed. So with the read paths timing being optimized after read deskew, the data error check done by the memory controller through the read followed by the write to the same address is most likely caused by the prior write to the same address.

In deskew training of DQ bit paths with reference to the DQS signals, a sweep of deskew delay lines on DQ bits may be performed along with the each write and read transaction to and from same address. Along with each round trip loop of transaction followed by data error check, the memory controller can compile a data passing window associated with the sweep of deskew delay lines. The deskew control logic picks the middle settings of the deskew delay line of each DQ bit as the final set of deskew settings. This set of deskew settings for the write is then stored aside for later use. Because the same deskew delay line of each DQ bit is used for both read and write operation, the previously stored deskew settings may be applied to the delay line appropriately for read or write operations.

Figure 5B:
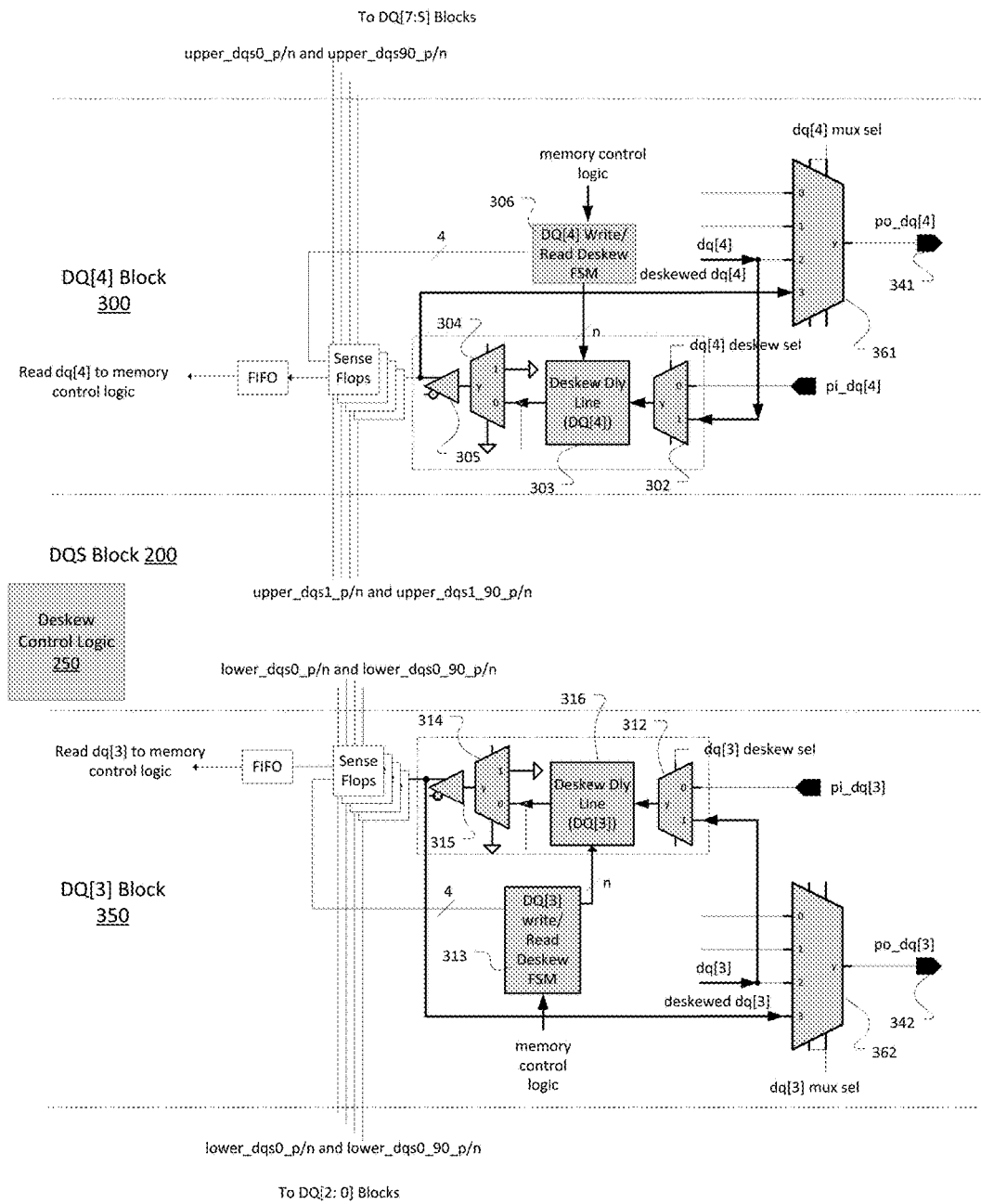
FIG. 5B illustrates the configuration of the DQ logic blocks in the exemplary interface logic with the highlighted signal paths used in write deskew training of the DQ bit paths in the ×4 mode in accordance with an embodiment of the present disclosure.

FIG. 5B illustrates the configuration of the DQ logic blocks 300 and 350 in the exemplary interface logic with the highlighted signal paths used in write deskew training of the DQ bit paths in the ×4 mode in accordance with an embodiment of the present disclosure. The active components and signal paths are shown in shade and arrowed bold lines. In this process, the write leveling logic is anchored at the common write leveling setting, the DQS0 and DQS1 deskew delay lines (213 and 262 in FIG. 5A) are anchored at the first and second deskew settings and used as common reference points for the lower and upper DQ bits, respectively.

For example, in the DQ[4] block 300, the data bit signal "dq[4]" is generated by the memory controller and output to the Deskew Dly Line (DQ[4]) 303 via the MUX 302, as controlled by the select signal "dq[4] deskew sel" signal. The delayed signal then propagates through the MUX 304, the buffer 305 and is output from the MUX 361 to the output pin po_dq[4]. By control of the deskew control logic 250, the DQ[4] Write/Read Deskew FSM 306 adjusts the Deskew Dly Line (DQ[4]) 303 along with data error checks in the iterative loops. As a result, optimized write deskew setting for DQ[4] can be achieved.

For example, in the DQ[3] block 350, the data bit signal "dq[3]" is generated by the memory controller and output to the Deskew Dly Line (DQ[3]) 316 by the MUX 312, as controlled by the select signal "dq[3] deskew sel." The delayed signal then passes through the MUX 314, the buffer 315 and output from the MUX 362 to the output pin po_dq[3]. The DQ[3] Write/Read Deskew FSM 313 adjusts the Deskew Dly Line (DQ[3]) 313 along with data error checks in the iterative loops by the memory controller. As a result, optimized write deskew setting for DQ[3] can be achieved.

More specifically, for each DQ bit, a range of compensation skews is swept across to identify an optimal compensation skew for that bit. In particular, a particular compensation skew may be chosen and applied. A bit value written to the memory with a bit value read back from the memory, by using the associated strobe signal (DQS0 or DQS1), is compared to check if it results in a write error. After repeating this procedure for all bits, a new compensation skew is obtained by incrementing or decrementing the old one. The procedure may then begin over again with the new compensation skew. This procedure can be performed for multiple bytes of a memory interface concurrently. For example, bit 0 of all bytes can be tested at the same time, then bit 1 of all bytes can be tested, etc. Also, in some embodiments, instead of repeating the procedure sequentially for each bit of a byte, the error for all bits of all bytes is analyzed in parallel.

In more detail, for each value of compensation skew, each bit is written into memory and then the bit is read back. If the value read back is consistent with the value written, then that compensation skew is identified as one of several possible choices for the optimal compensation skew that could be applied to that bit. This process may be carried out in parallel for all bits.

The set of candidate passed compensation skews may then be examined to determine the optimal compensation skew for each bit. These optimal compensation skews are then assigned to each bit.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law. Any claimed embodiment of the invention does not necessarily include all of the objects or embodiments of the disclosure.

What is claimed is:

1. A method comprising:
   at a memory controller, generating a first strobe signal associated with data signals of a first set of bits of a byte;
   at the memory controller, generating a second strobe signal associated with data signals of a second set of bits of said byte;
   obtaining a write leveling setting for said first strobe signal based on feedback of said first set of bits; and
   while anchoring at said write leveling setting, adjusting a first delay line for said second strobe signal to obtain a first deskew setting based on feedback of said second set of bits.

2. The method of claim 1, wherein said obtaining said write leveling setting comprises adjusting write leveling logic that is configured for delaying both said first strobe signal and said second strobe signal at said write leveling setting in write operations.

3. The method of claim 2 further comprising:
   determining second deskew settings for second delay lines associated with said first set of bits; and
   determining third deskew settings for third delay lines associated with said second set of bits.

4. The method of claim 3, wherein said adjusting said write leveling logic comprises adjusting a delay component in said write leveling logic until any bit of said first set of bits asserts without regard to feedback of said second set of bits.

5. The method of claim 4, wherein said adjusting said first delay line comprises:
   responsive to said write leveling setting causing any bit of said second set of bits to assert, decreasing a setting of said first delay line until none of said second set of bits assert; and
   incrementing said setting of said first delay line until any of said second set of bits asserts to obtain said first deskew setting.

6. The method of claim 5, wherein said adjusting said first delay line comprises, responsive to said write leveling setting causing none of said second set of bits to assert, incrementing said setting of said first delay line setting until any of said second set of bits asserts to obtain said first deskew setting.

7. The method of claim 3 further comprising using said write leveling setting, said first deskew setting, said second deskew settings and said third deskew settings in memory write operations with a first data interface configuration of said memory controller.

8. The method of claim 7 further comprising:
   with a second data interface configuration of said memory controller, determining a fourth deskew setting for said first delay line; and
   using said fourth deskew setting to deskew a data bus inversion (DBI) signal in memory write operations with said second data interface configuration.

9. The method of claim 1 further comprising: adjusting a fifth delay line for said first strobe signal after said adjusting said write leveling logic and before obtaining said first deskew setting and, wherein said fifth delay lines has a higher adjustment resolution than said write leveling logic, wherein said adjusting said fifth delay line comprises: reviewing an assertion of any bit of said first set of bits; and decrementing a setting of said fifth delay line until none of said first set of bits assert.

10. A integrated circuit comprising:
    memory control logic configured to generate a first strobe signal associated with a first set of bits of a byte and a second strobe signal associated with a second set of bits of said byte;
    a first delay line for said second strobe signal;
    second delay lines for said first set of bits;
    third delay lines for said second set of bits;
    a transmitting interface configured to transmit said first strobe signal and said second strobe signal to one or more memory storage devices;
    write leveling logic comprising an adjustable delay component configured to delay both said first strobe signal and said second strobe signal, wherein said write leveling logic is configured to adjust said adjustable delay component to obtain a write leveling setting based on feedback of said first set of bits from one of said one or more memory storage devices; and
    deskew control logic configured to, while said write leveling logic is anchored at said write leveling setting, adjust said first delay line to obtain a first deskew setting thereof based on feedback of said second set of bits from one of said one or more memory storage devices.

11. The integrated circuit of claim 10, wherein said deskew control logic is further configured to:
    determine second deskew settings for second delay lines associated with said first set of bits; and
    determine third deskew settings for third delay lines associated with said second set of bits.

12. The integrated circuit of claim 10, wherein said write leveling logic is configured to adjust said adjustable delay component until any bit of said first set of bits asserts to obtain said write leveling setting, wherein said adjustable delay component is adjusted without regard to feedback of said second set of bits.

13. The integrated circuit of claim 12, wherein said deskew control logic is configured to adjust said first delay line by performing:
    responsive to said write leveling setting causing any bit of said second set of bits to assert, decreasing a setting of said first delay line until none of said second set of bits assert; and
    incrementing said setting of said first delay line setting until any of said second set of bits asserts to obtain said first deskew setting.

14. The integrated circuit of claim 12, wherein said deskew control logic is configured to adjusting said first delay line by, responsive to said write leveling setting causing none of said second set of bits to assert, incrementing said setting of said first delay line until any of said second set of bits asserts to obtain said first deskew setting.

15. The integrated circuit of claim 11, wherein said deskew control logic is further configured to use said write leveling setting, said first deskew setting, said second deskew settings and said third deskew settings in memory write operations with a first data interface configuration of said memory controller.

16. The integrated circuit of claim 15, wherein said memory control logic is further configured to:
    determine a fourth deskew setting for said first delay line; and
    use said fourth deskew setting to deskew a data bus inversion (DBI) signal associated with both said first set and said second set of bits in memory write operations with a second data interface configuration of said memory controller.

17. The integrated circuit of claim 10, wherein said first set of bits correspond to least-significant 4 bits of said byte, and wherein said second set of bits correspond to most-significant 4 bits of said byte.

18. A method of write deskew training, the method comprising:
- at a memory controller, transmitting a first strobe signal and a second strobe signal respectively associated with a first set of bits of a byte and a second set of bits of the byte;
- adjusting write leveling logic to obtain a write leveling setting based on feedback of said first set of bits and without regard to feedback of said second set of bits, wherein said write leveling logic is operable to delay both said first strobe signal and said second strobe signal at said write leveling setting during memory write operations;
- with said write leveling logic anchored at said write leveling setting, adjusting a first delay line for said second strobe signal to obtain a first deskew setting based on feedback of said second set of bits;
- determining second deskew settings for second delay lines associated with said first set of bits; and
- determining third deskew settings for third delay lines associated with said second set of bits.

19. The method of claim 18, wherein said adjusting said first delay line comprises:
- when said write leveling setting causes any bit of said second set of bits to assert, decreasing a setting of said first delay line until none of said second set of bits assert; and
- incrementing said setting of said first delay line until any of said second set of bits asserts to obtain said first deskew setting.

20. The method of claim 19, wherein said adjusting said first delay line comprises, if said write leveling setting causes none of said second set of bits to assert, incrementing said setting of said first delay line setting until any of said second set of bits asserts to obtain said first deskew setting.

21. The method of claim 18 further comprising, before said first deskew setting is obtained and after said adjusting said write leveling logic, adjusting a fourth delay line for said first strobe signal, wherein said fourth delay line has a higher adjustment resolution than said write leveling logic, and wherein further said adjusting said fourth delay line comprises:
- reviewing an assertion of any bit of said first set of bits; and
- decrementing a setting of said fourth delay line until none of said first set of bits assert.

* * * * *